United States Patent [19]

Matsui

[11] Patent Number: 4,808,544

[45] Date of Patent: Feb. 28, 1989

[54] LDD STRUCTURE CONTAINING CONDUCTIVE LAYER BETWEEN GATE OXIDE AND SIDEWALL SPACER

[75] Inventor: Hiroshi Matsui, Tokyo, Japan

[73] Assignee: Oki Electric Industry Co., Ltd., Tokyo, Japan

[21] Appl. No.: 174,494

[22] Filed: Mar. 28, 1988

[30] Foreign Application Priority Data

Mar. 6, 1987 [JP] Japan ................. 62-70381

[51] Int. Cl.$^4$ ........................... H01L 29/60
[52] U.S. Cl. .................... 437/44; 357/23.3
[58] Field of Search ................ 437/44; 357/23.3

[56] References Cited

U.S. PATENT DOCUMENTS

| 4,642,878 | 2/1987 | Maeda ........................ 437/44 |
| 4,663,645 | 5/1987 | Komori et al. ............ 357/23.5 |
| 4,727,038 | 2/1988 | Watabe et al. ............... 437/29 |
| 4,754,320 | 6/1988 | Mizutani et al. ............ 357/23.5 |

OTHER PUBLICATIONS

"Fabrication of High Performance LDD FET's with Oxide Sidewall-Spacer Technology", P. J. Tsang et al., IEEE, vol. ED-29, #4, Apr. 1982.

Primary Examiner—Olik Chaudhuri
Attorney, Agent, or Firm—Wenderoth, Lind & Ponack

[57]. ABSTRACT

A method for manufacturing a semiconductor device is disclosed in which two essential process steps of forming a side wall spacer insulating film on a side wall of the gate electrode layer by reactive ion etching the silicon oxide film and preserving the conductive layer only beneath the side wall spacer insulating film by reactively ion-etching the conductive layer are included.

1 Claim, 2 Drawing Sheets

LDD STRUCTURE CONTAINING CONDUCTIVE LAYER BETWEEN GATE OXIDE AND SIDEWALL SPACER

BACKGROUND OF THE INVENTION

The present invention relates to a method for manufacturing a semiconductor device and more particularly for manufacturing a transistor having a high density LDD (Lightly Doped Drain) structure.

A prior art method for manufacturing a transistor in connection with these kinds of semiconductor devices is exemplified in "Electron Device (1982) vol. ED-209, No. 4, Pages 590-596". FIGS. 2(a)~(e) show sectional views corresponding to process steps of the prior art method disclosed in the above reference.

First, a field oxide film 2 and a gate oxide film 3 are formed by deposition on a predetermined area of a P-type silicon substrate 1 (hereinafter simply called a substrate) selectively and respectively. Thereafter, a phosphorus doped polysilicon layer 4 and a refractory metal silicide layer 5 such as $WSi_2$ and $MoSi_2$ are deposited consecutively on the gate oxide layer 3 so as to form a polycide gate electrode layer.

Then, $N^-$ layers 6 for sourse and drain regions are formed in the substrate 1 by ion-implanting.

Moreover, a silicon oxide film 7 is deposited by a CVD (Chemical Vapour Deposition) process all over the surface of the substrate 1 containing the field oxide film 2 and the polycide gate electrode layers 4 and 5. Then, the silicon oxide film 7 is selectively etched by RIE (Reactive Ion Etching) such a manner that the silicon oxide film 7 is preserved on the sidewall of the polycide gate electrode layers as a sidewall spacer insulating film 7a.

Then, after forming an $N^+$ layer 8 is formed by ion implanting arsenic (As) impurities at a high concentration into the substrate 1, an intermediate insulating layer for example (BPSG film) 9, a contact region 10 and an aluminum interconnection layer 11 are consecutively formed pursuant to a well-known process technology to manufacture an N-type channel transistor.

According to the above-mentioned prior art method, hot carriers generated beneath the sidewall spacer insulating film 7a can be trapped by the gate oxide film 3 because the sidewall spacer insulating film 7a does not constitute a gate electrode, thereby causing resistance increase of the $N^-$ layer 6 at the beginning of operational test to induce the mutual conductance, gm, aggravation. In addition, there is a problem that an offset gate can be easily generated in the case of P-type channel transistors. There is also another problem that in the case of forming the side wall spacer insulating film 7a of RIE of the silicon oxide film 7, the field oxide film 2 is reduced in thickness due to overetching, thereby aggravating the element isolation characteristic.

SUMMARY OF THE INVENTION

It is therefore an object of the present invention to provide a method for manufacturing a semiconductor device which can prevent hot carriers from being trapped into a gate oxide film thereby compressing a generation of offset gate.

It is another object of the present invention to provide a method for manufacturing a semiconductor device which can prevent a reduction in thickness of a field oxide film.

These objects will become more apparent when a preferred embodiment of this invention is considered in connection with the drawings.

In this invention, there is provided a method for manufacturing a semiconductor device comprising the following steps of (a) forming respectively a field oxide film and a gate oxide film on a predetermined area of a silicon substrate;

(b) forming a gate electrode layer on the gate oxide film;

(c) accumulating a conductive material layer on the field oxide film, the gate oxide film and the gate electrode layer;

(d) accumulating a silicon oxide film on the conductive layer;

(e) forming a sidewall spacer insulating film on a sidewall of the gate electrode layer by reactively ion-etching the silicon oxide film; and (f) preserving the conductive layer only beneath the side wall spacer insulating film by reactively ion-etching the conductive layer.

According to this invention, hot carriers generated beneath the sidewall spacer insulating film cannot be trapped into the gate oxide film because the conductive layer is formed within the sidewall spacer insulating film and is connected to the gate electrode layer.

Moreover, the conductive layer protects the field oxide film and the gate oxide film from being reduced in thickness in the event of etching of silicon oxide films.

DETAILED DESCRIPTION OF THE PREFERRED EMBODIMENT

Figure 1:
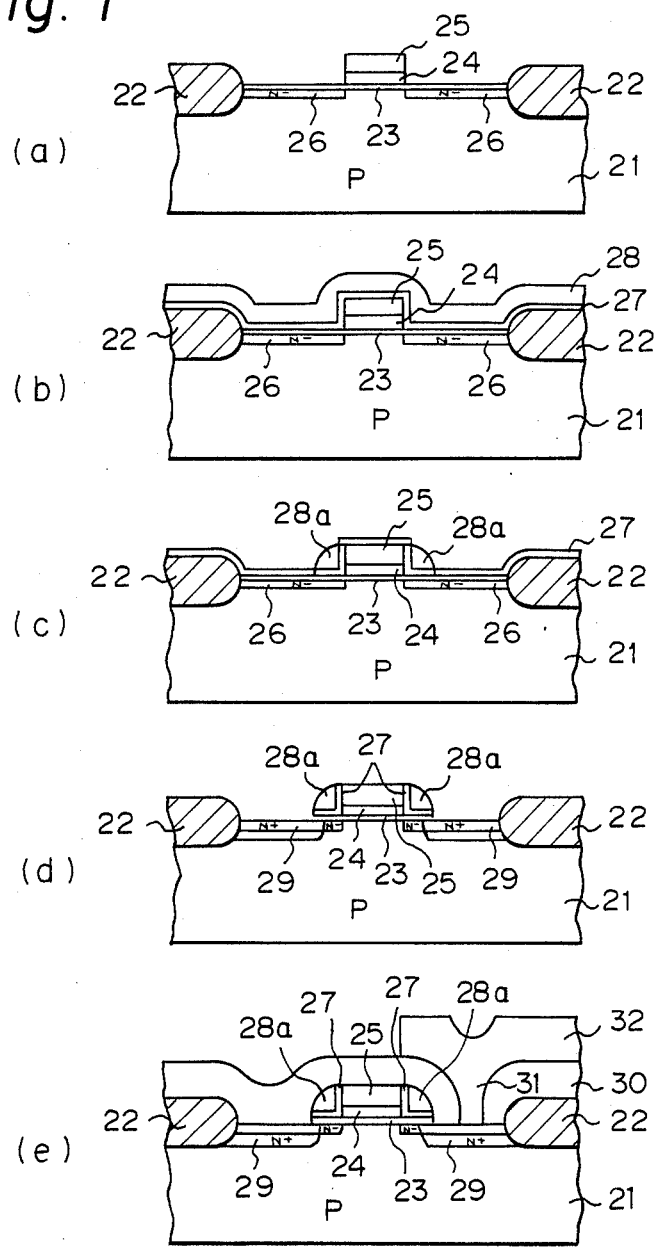
FIGS. 1 (a) through (e) are sectional views corresponding to process steps of the present invention.
Figure 2:
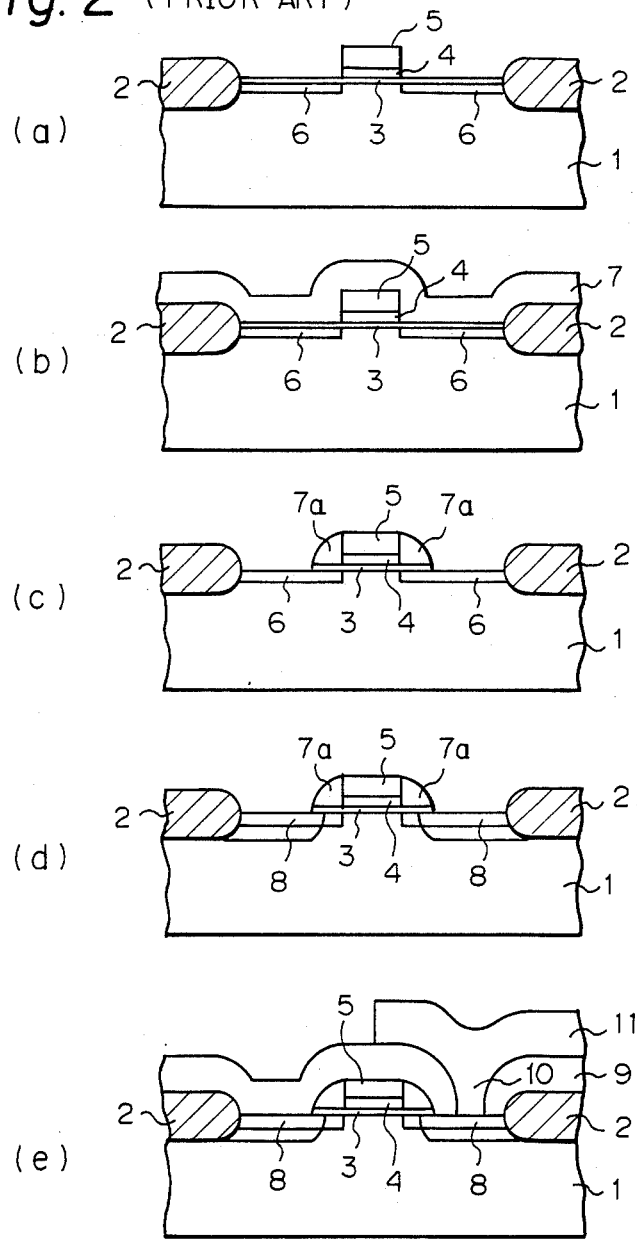
FIGS. 2(a) through (e) are sectional views corresponding to process steps of the prior art.

FIGS. 1(a) through (e) show sectional views corresponding to steps of the present invention.

According to the invention, a P-type semiconductive silicon substrate 21 (hereinafter simply called a substrate) is prepared, and a field oxide film 22 of 4,000 Å in thickness is formed on the substrate 21. Whereas, a gate oxide film 23 of 200 Å in thickness is formed on the remaining region of the substrate 21. Then, a gate electrode layer with such a polycide structure that a phosphorus doped polysilicon layer 24 of 1500 Å in thickness is covered with W-silicide layer 25 of 1500 Å n thickness is formed on the entire surface of the gate oxide film 23 to be patterned.

In this occasion, the gate oxide film 23 remains without being etched. Thereafter, $As^+$ ions are implanted into source and drain regions in the substrate 21 as an energy of 40 KeV to a dose of $1-2 \times 10^{13}$ ions/cm² to achieve $N^-$ layers 26.

Then, a conductive layer 27 composed of thin film conductive material of 300 to 1,000 Å in thickness such as phosphorus doped polysilicon layer with approximately $5 \times 10^{20}$/cm³ in concentration of W-silicide layer is formed by deposition and covered with a silicon oxide film 28 of 4,000 Å in thickness, which is usually formed by a CVD process.

Then, the silicon oxide film 28 is etched by way of a RIE method wherein the etching speed of the conductive layer 27 is greater than that of the silicon oxide film 28 to form a sidewall spacer insulating film 28a on a sidewall of the electrode layers 24 and 25 without etching the conductive layer 27 therebeneath.

As to the RIE method mentioned above, in the case that the conductive layer 27 is made of polysilicon the etching process can be conducted in fluoride gas atmosphere such as $C_2F_6$.

Thereafter, a RIE method in which an etching speed of the conductive layer 27 is faster than that of the sidewall spacer insulating film 28a is applied to preserve the conductive layer 27 only beneath the sidewall spacer insulating layer 28a without etching the gate oxide film 23 and the field oxide film 22.

For example, in the case that the conductive layer 27 is of a polysilicon, the etching process can be conducted again in a cloride gas atmosphere such as $CCl_4$.

Consequently, the gate oxide film 23 is removed by etching except the beneath portion of both the conductive layer 27 and the gate electrode layers 24 and 25 under the prescribed RIE condition without etching the substrate 21.

Then, As+ ions are implanted into source drain regions in the substrate 21 at an energy of 40 KeV to a dose of $5 \times 10^{15}$ ions/cm$^2$ and activated by thermal treatment of 900° C. in nitrogen gas($N_2$) atmosphere to achieve an N+ layer 29.

After that, a BPSG film 30 of 7,000 Å in thickness is formed and is patterned to define the prescribed contact region 31.

Then, an aluminum interconnection layer 32 of 1 μm in thickness is formed covering the contact region 31.

As described above in detail, the conductive layer 27 prevents reduction of thickness both of the field oxide film 22 and the gate oxide film 23 in the event of etching the silicon oxide film 28 to achieve the sidewall spacer insulating film 28a addition, hot carries generated beneath the sidewall. spacer insulating film 28a cannot be trapped into the gate oxide film 23 due to the conductive layer 27.

What is claimed is:

1. A method for manufacturing a semiconductor device comprising the steps of:
    (a) forming respectively a field oxide film and a gate oxide film on a predetermined area of a silicon substrate;
    (b) forming a gate electrode layer on the gate oxide film;
    (c) accumulating a conductive material layer on the field oxide film, the gate oxide film and the gate electrode layer;
    (d) accumulating a silicon oxide film on the conductive layer;
    (e) forming a sidewall spacer insulating film on a sidewall of the gate electrode layer by reactively ion-etching the silicon oxide film; and
    (f) preserving the conductive layer only beneath the side wall spacer insulating film by reactively ion-etching the conductive layer.

* * * * *